United States Patent
Benner (10) Patent No.: US 6,657,211 B2
(45) Date of Patent: Dec. 2, 2003

(54) PROCESS FOR ELECTRON BEAM LITHOGRAPHY, AND ELECTRON-OPTICAL LITHOGRAPHY SYSTEM

(75) Inventor: Gerd Benner, Aalen (DE)

(73) Assignee: Leo Elektronenmikroskopie, Oberkochen (DE)

(*) Notice: Subject to any disclaimer, the term of this patent is extended or adjusted under 35 U.S.C. 154(b) by 262 days.

(21) Appl. No.: 09/906,188

(22) Filed: Jul. 16, 2001

(65) Prior Publication Data

US 2002/0043629 A1 Apr. 18, 2002

(30) Foreign Application Priority Data

Jul. 14, 2000 (DE) .......................... 100 34 412

(51) Int. Cl.$^7$ ................................ H01J 37/30
(52) U.S. Cl. ................................ 250/492.22
(58) Field of Search ................ 250/492.1, 492.2, 250/492.23, 492.3

(56) References Cited

U.S. PATENT DOCUMENTS

| | | |
|---|---|---|
| 3,876,883 A | 4/1975 | Broers et al. |
| 4,140,913 A | 2/1979 | Anger et al. |
| 6,232,612 B1 * | 5/2001 | Nakajima ............ 250/492.23 |

FOREIGN PATENT DOCUMENTS

EP 0 367 496 B1 9/1990 ............ H01J/37/30

* cited by examiner

*Primary Examiner*—Huan Tran (57) ABSTRACT

The present invention relates to a method for electron beam lithography that consists of a combination of electron beam projection lithography and electron beam writing. In a first step, the exposure of the substrate takes place by imaging of a mask. In a second step, structures not present on the mask are written on the substrate by electron beam writing. The invention furthermore relates to an electron-optical lithography system that can be used both for projection lithography and for electron beam writing. The system has a projective system by means of which a mask plane can be imaged on a reduced scale in a substrate plane. The system furthermore has an electron-optical illumination system by means of which selectively either a large field in the mask plane can be illuminated or the electron beam can be focused in the mask plane or can be shaped to a desired beam profile.

32 Claims, 4 Drawing Sheets

PROCESS FOR ELECTRON BEAM LITHOGRAPHY, AND ELECTRON-OPTICAL LITHOGRAPHY SYSTEM

CROSS-REFERENCES TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Technical Field

The invention relates to the combination of two different methods that are used in electron beam lithography, namely electron beam writing and electron beam projection lithography.

2. Background Art

In electron beam writing, the substrate is sequentially exposed by means of a focused electron beam, wherein the beam either scans in the form of lines over the whole specimen and the desired structure is written on the object by corresponding stopping-out of the beam, or, as in the vector scan method, the focused electron beam is guided only over the regions to be exposed. Electron beam writing is distinguished by high flexibility, since the circuit geometries are stored in the computer and can be optionally varied. Furthermore, very high resolutions can be attained by electron beam writing, since electron foci with diameters smaller than 100 nm can already be attained with simple electron-optical imaging systems. However, it is disadvantageous that the process is very time-consuming, due to the sequential, pointwise writing. Electron beam writing is therefore at present mainly used for the production of the masks required in projection lithography.

Electron beam writers are based, as regards equipment technology, on scanning electron microscopes, which are as a rule considerably simpler than transmission electron microscopes. In addition to the usual components for a scanning electron microscope, all that is further required is a so-called beam-blanker, by means of which the electron beam can be deflected onto a diaphragm in order to switch the electron beam "off" at the places which are not to be exposed.

In electron beam projection lithography, analogously to optical lithography, a larger portion of a mask is illuminated simultaneously and is imaged on a reduced scale on a wafer by means of a projection optics. Since a whole field is imaged simultaneously in electron beam projection lithography, the attainable throughputs can be markedly higher in comparison with electron beam writers. However, due to the lens aberrations of uncorrected electron-optical systems, only subfields of the mask, of size about 1 mm×1 mm, can be simultaneously imaged on a reduced scale on the wafer. For the exposure of a whole circuit, these subfields have to be placed against each other by an electron-optical or mechanical displacement, or by a combination of the two displacement methods.

A corresponding electron beam projection lithography system is known, for example, from U.S. Pat. No. 3,876,883.

It is already described there that for adjusting the mask and wafer relative to each other, the excitation of the condenser ahead of the mask can be varied such that the electron beam is focused on the mask. The subsequent projection system then images onto the wafer the electron focus arising in the mask plane.

Further similar electron beam projection lithography systems are described, for example, in U.S. Pat. No. 4,140,913 and in European Patent Document 0 367 496.

A disadvantage of electron beam projection lithography systems is that a corresponding mask is necessary for each structure to be exposed. The preparation of customer-specific circuits in small numbers is not economic, because of the high costs associated with mask production.

A known intermediate form between electron beam writing and electron beam projection lithography is writing with a shaped electron beam. Instead of a focused electron beam, the profile of the electron beam is shaped using a diaphragm, and the diaphragm is projected onto the substrate to be exposed. The diaphragm apertures have standard geometric shapes, the overall pattern to be produced on the substrate then being combined from these geometric standard shapes. This variant thus manages without specific masks, but is only slightly faster than writing with a focused electron beam, and is markedly slower than electron beam projection lithography.

SUMMARY OF THE INVENTION

The object of the present invention is to provide a method and an electron beam projection lithography system with which customer-specific circuits can be produced very economically, even in small numbers.

This object is attained by an electron beam projection lithography system comprising an electron source providing an electron beam, a condenser system, a mask plane behind the condenser system as seen in the direction of the electron beam, a substrate plane, a projective system that follows the mask plane as seen in the direction of the electron beam and is excitable such that the mask plane is imaged on a reduced scale in the substrate plane, a control system, and a projector deflection system in or before the projective system as seen in the direction of the electron beam, wherein the control system is arranged to change over condenser excitation or deflection elements such that a small focused or shaped beam profile is produced is the mask plane and wherein the projector system is driven such that a focused or shaped electron beam with a small beam profile is movable in the substrate plane along stored or computed paths. The object is attained by a method of electron beam lithography comprising in a first step electron-optically imaging a mask by a projective system on a substrate to be exposed arranged in a substrate plane, and in a second step guiding a focused electron beam or an electron beam with a shaped profile over the substrate by focusing the electron beam in a plane of the mask or shaping a beam profile of the electron beam before the plane of the mask and deflecting the focused electron beam or the electron beam with a shaped profile by a deflection system.

The present invention is based on a combination of electron beam projection lithography with electron beam writing in a single apparatus. In the method according to the invention, firstly a mask is electron-optically imaged in a first step onto the substrate to be exposed by means of a projective system. For this purpose, the mask has the coarser structures to be produced and/or universally necessary structures. In a second step, by focusing the electron beam in the mask plane or by forming the electron beam ahead of the mask plane by means of a diaphragm, further imaging onto the substrate to be exposed of the focus arising in the mask plane, or of the image of the beam shaping diaphragm arranged ahead of the mask plane, and targeted deflection of the electron focus or of the shaped electron beam in the substrate plane by a deflecting system, the fine structure not present in the mask but nevertheless necessary, and/or the conductor paths and other structures not present in the mask but nevertheless corresponding to the customer's requirements, are written onto the substrate.

Electron beam writing takes place, according to a first embodiment of the invention, by means of an electron beam that is focused in the substrate plane. In a second embodiment, the electron beam writing takes place with an electron beam shaped by a diaphragm, the diaphragm then having regions that have standard shapes and are transmissive for electrons.

Both steps of the combination according to the invention can of course be carried out one after another with multiple iterations, for the exposure of larger fields on the substrate. Since both steps are carried out in multiple succession with the same apparatus, no readjustment of the substrate relative to the optical axis of the apparatus is required between the two steps.

An electron beam projection lithography system according to the invention has an electron source, a preferably multi-stage condenser, a mask plane provided following the condenser, and a projective system following the mask plane. The projective system can be excited such that the mask is imaged on the substrate on a reduced scale. By means of a control system, the condenser excitation can be changed over, or can be deflected onto a further diaphragm, such that the electron beam alternatively either uniformly illuminates the mask plane over a larger field, or is focused in the mask plane, or has a small, shaped beam cross section in the mask plane. A deflection system is furthermore provided in or before the projective system and can be driven such that a focused or shaped electron beam can be moved over the substrate along stored or computed paths.

Differing from the lithography system known from U.S. Pat. No. 3,876,883, in the lithography system according to the invention, with the electron beam focused in the mask plane, the electron beam is scanned with the projective scanner. For this purpose, the projective scanner is coupled to a pattern generator that produces the structures to be written. The condenser deflecting system is constantly driven in this mode of writing so that the electron beam can pass through a hole in the mask.

In an embodiment of the invention with a multi-stage condenser, a condenser aperture diaphragm is provided which is arranged, seen in the beam direction, ahead of the mask plane. The plane in which this condenser aperture diaphragm is arranged is then to coincide with that plane in which an image of the electron source arises in the projection mode and thus with uniform illumination of the mask plane. This condenser aperture diaphragm is then without importance in the projection mode, and serves in the writing mode simultaneously for the definition of the illumination aperture and also as a dark scanning diaphragm through the deflection, by means of a condenser deflection system, of the electron beam onto the diaphragm at places which are not to be exposed.

A further diaphragm, a field diaphragm in the projection mode, is furthermore preferably provided between the condenser lenses. This field diaphragm is then arranged in a plane that corresponds to the source-side object plane of the last condenser lens and consequently is sharply imaged in the mask plane by the last condenser lens.

It should be mentioned at this point that the changeover between the writing mode and the projection mode takes place by a change of the excitation of the first, source-side condenser lenses, or by targeted deflection of the electron beam onto a diaphragm in the condenser and that excitation of the last condenser lens preceding the mask plane, is constant in both modes, so that the focal planes and the entry and exit image planes of the last condenser lens are fixed in both modes.

In a further embodiment, the last condenser lens and the first projective lens are formed by a single, so-called condenser-objective single field lens, with the mask plane situated in the gap center of the condenser-objective single field lens. By this means, the known small axial aberration coefficients, in particular energy dependent aberration coefficients, known for condenser-objective single field lenses can be realized.

Since in the system according to the invention the projective system is also not changed, as regards its excitation, on changing over between writing mode and projection mode, the last lens of the projective system can furthermore also be constituted as a condenser-objective single field lens, only the effect of the entry-side field of this lens being used for the imaging of the electron beam. Although this may appear at first sight to be over-dimensioned, since only the entry-side partial field of this second condenser-objective lens is used, some advantages nevertheless accrue. Since the overall system, in spite of its high flexibility, needs only two condenser lenses and two condenser-objective single field lenses, and both condenser-objective single field lenses can have a substantially identical construction and are to differ only as regards a linear scaling factor which corresponds to the imaging scale between the mask plane and the substrate plane, an advantage results in the first place as regards production technology. With a geometrically similar construction of both condenser-objective single field lenses, there furthermore results a corresponding geometrical similarity of the magnetic fields of both projection lenses, so that the off-axis aberrations e.g. the isotropic and anisotropic distortion, of both projective lenses can be mutually compensated. For this aberration compensation, the two condenser-objective single field lenses are to be operated with mutually inverse polarization of the focusing magnetic fields.

A further advantage of a second condenser-objective single field lens is the good detectability of secondary electrons emergent from the substrate to be exposed, since the substrate is arranged in the focusing magnetic field of the condenser-objective single field lens, and the secondary electrons are collected by this magnetic field in a known manner.

In the method according to the invention and in connection with the system according to the invention, a mask is preferably used which has subfields separated from each other by webs. Successive different subfields can then be uniformly illuminated by the deflection of the electron beam by means of the deflecting system provided in the condenser, and can be successively projected, spatially adjoining each other, by suitable return deflection of the electron beam by the deflection system in the projective system.

The mask furthermore preferably has holes in the webs, having a diameter greater than the diameter of the electron beam focused by the condenser. The electron beam in writing mode is then deflected onto these holes, so that the electron beam can pass through the mask unhindered. A suitable arrangement of the holes furthermore permits at least a coarse adjustment of the mask to the electron beam.

Additionally, for the sequential exposure of fine structures or customer-specific structures, the electron beam focused in the mask plane—or shaped ahead of the mask plane—can of course also serve for the adjustment of the subfields of the mask relative to the substrate to be exposed, as is described in the above cited U.S. Pat. No. 3,876,883. Furthermore, the electron beam focused in the mask plane—or shaped ahead of the mask plane—can also be used for post-exposure of erroneous mask structures or for the elimination of holes in the mask by electron beam stimulated metal deposition, and can thus be used for mask repair. The system according to the invention is thus distinguished as a whole by very flexible possibilities of use.

BRIEF DESCRIPTION OF THE DRAWINGS

The invention is explained in more detail hereinafter, with reference to the embodiments shown in the accompanying Figures. In detail.

DETAILED DESCRIPTION OF THE INVENTION

Figure 1:
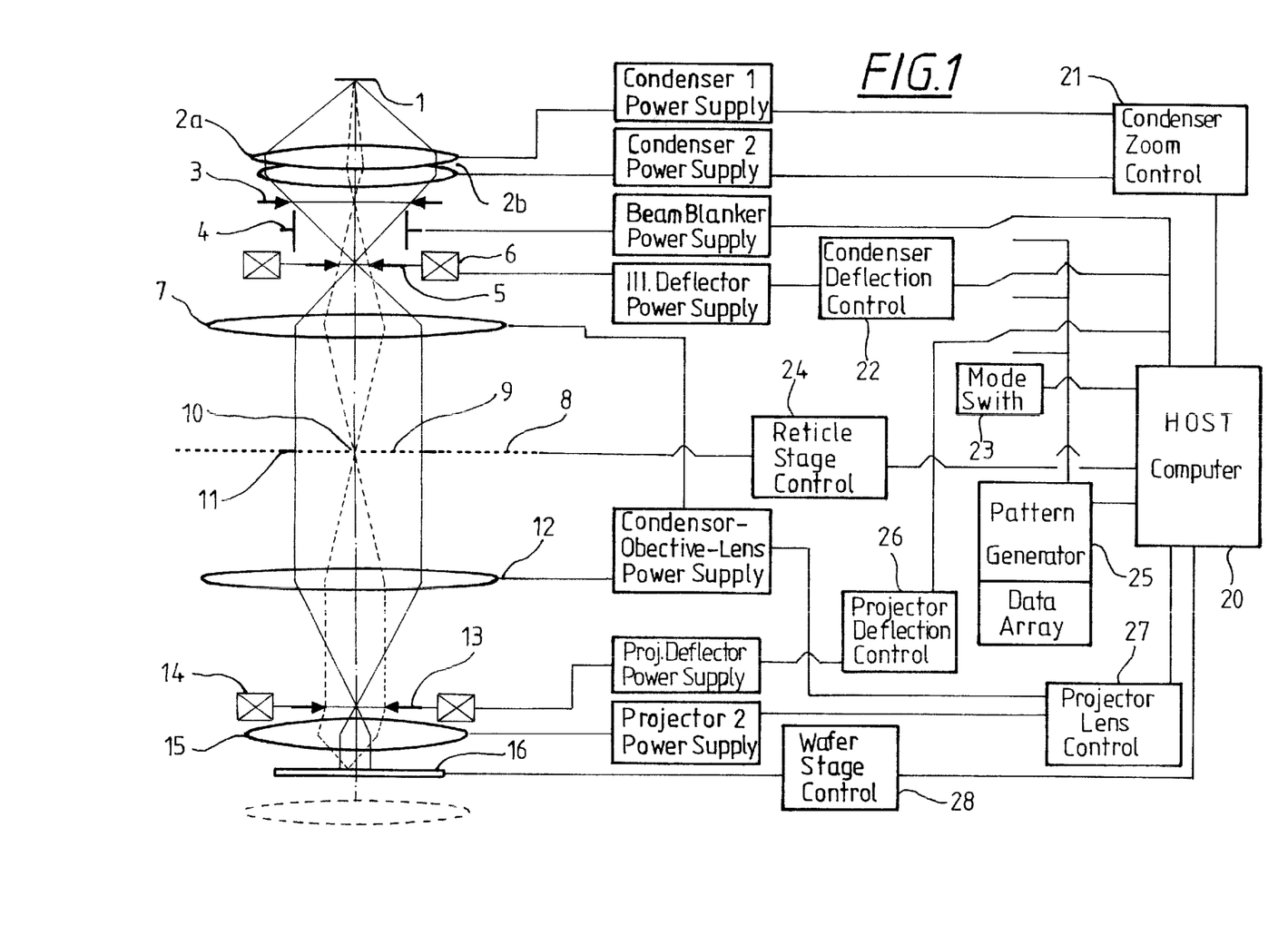
FIG. 1 shows a schematic diagram of a first embodiment of the electron-optical lithography system.

The embodiment of a lithography system shown in FIG. 1 has an electron source (1), for example in the form of a thermal emitter such as a $LaB_6$ cathode, and a multi-stage condenser system following the electron source. The electron source can in its turn ideally be changed over between a first mode of operation with relatively large-surface emission at high current (for the projection mode) and a second mode with a high directional beam value (for the writing mode). The multi-stage condenser system contains two source-side magnetic lenses (2a, 2b), and also, following these, the source-side pre-field (7) of a condenser-objective single field lens (7,12). A field diaphragm (3) is arranged in the source-side object plane of the pre-field (7) of the condenser-objective single field lens, and an aperture diaphragm (5) is arranged in the source-side focal plane of the condenser-objective single field lens (7, 12). A rapid electrostatic deflection system (4), a so-called beam blanker, is provided between these two diaphragms, and serves to deflect the electron beam onto the electron-impermeable regions of the aperture diaphragm (5), to switch the electron beam off. Furthermore, a condenser deflection system (6) is provided in the source-side focal plane of the condenser-objective single field lens (7, 12), and serves to deflect the electron beam in a targeted manner from the optical axis, so that the electron beam runs parallel to the optical axis and thereby illuminates different subfields (9) of the mask in the mask plane (8). The mask plane itself is situated in the center, that is, in the pole shoe gap of the condenser-objective single field lens (7, 12). A mask table, not shown in FIG. 1, is arranged in this mask plane, and makes possible a displacement of a mask arranged on it in two mutually perpendicular directions, perpendicular to the optical axis of the electron-optical system.

The condenser deflection system (6) is shown in FIG. 1 as a single deflection system. In practice, this deflection system can also be constituted as a double deflection system, which makes possible a deflection of the electron beam in two mutually perpendicular directions with a virtual transition point which coincides with the source-side focal point of the condenser-objective single field lens (7,12).

On the projective side, a projector deflection system (14) follows the after-field (12), remote from the source (1), of the condenser-objective single field lens (7, 12), and likewise makes possible a deflection of the electron beam out of the optical axis in two mutually perpendicular directions (and likewise can be constituted as a double deflection system), and a last projection stage (15). This last projection stage (15) can then in its turn be the pre-field of a second condenser-objective single field lens which has the same geometry as the first condenser-objective single field lens (7, 12), but which is however made smaller by a linear scaling factor corresponding to the imaging scale of the electron beam pencil in both condenser-objective single field lenses. The magnetic field direction in the pre-field of the second condenser-objective single field lens (15) is inverse to the magnetic field direction in the after-field (12) of the first condenser-objective single field lens, so that a portion of the off-axis abberation coefficients of both lenses is compensated.

The beam paths shown in FIG. 1 indicate the imaging properties in the two different modes of operation of the electron-optical system.

In the projection mode, the two source-side condenser lenses (2a, 2b) are excited in common so that an image of the electron source—strictly speaking, of the crossover of the electron source—is imaged in the source-side focal plane of the last condenser lens (7) and thus in the source-side focal plane of the first condenser-objective single field lens (7, 12). A substantially parallel illumination is thereby attained in the mask plane (8). In this mode of operation, the mask plane (8) is imaged in the substrate plane (16) on a reduced scale by the after-field (12) of the first condenser-objective single field lens together with the pre-field (15) of the second condenser-objective single field lens. The wafer to be exposed is provided in this substrate plane (16) and is positioned in a known manner on a wafer table (not shown). The wafer table then makes it possible to mechanically displace the wafer perpendicularly to the optical axis of the electron-optical system, in order to thereby make possible the exposure of larger fields. The two partial fields (12, 15) of the condenser-objective single field lenses which form the projective system form a telecentric system, whose forward focal plane coincides with the mask plane (8), and whose rear focal plane coincides with the substrate plane (16).

The size of the field illuminated in the mask plane (8) is then determined by the size of the aperture of the field diaphragm (3). The illumination aperture is adjustable in this mode of operation by a change of the individual excitations of the two first condenser lenses (2a, 2b) that together form a zoom system. With a change of the illumination aperture there consequently takes place a change of the individual excitations such that both condenser lenses (2a, 2b) together always ensure an imaging of the source (1), or of its crossover, in the source-side focal plane of the pre-field (7) of the condenser-objective single field lens (7, 12).

On changing over into the writing mode, only the excitation of the two source-side condenser lenses (2a, 2b) is changed, and in fact such that both condenser lenses together produce an image of the source (1) in the plane of the field diaphragm (3). The subsequent condenser lens (7) and the imaging stages of the projective system remain unchanged in this changeover. It is thereby ensured that the pre-field (7) of the condenser-objective single field lens (7, 12) images the electron focus arising in the field diaphragm plane (3) into the mask plane (8), and the subsequent projective system images this electron focus on a reduced scale into the substrate plane.

The control system for the electron-optical system is schematically shown on the right-hand side of FIG. 1. The control of the electron-optical components and of the associated control units takes place by means of a host computer (20). This host computer (20) controls the control system (21) for the source-side condenser lenses (2a, 2b). The host computer (20) furthermore controls the control system (22) for the condenser deflection system (6), the control system (24) for the reticle table (not shown), the control system (26) for the projective deflection system (14), the control system (27) for the projective system (12, 15), including the last condenser lens which is formed by the pre-field (7) of the first condenser-objective single field lens, and the control system (28) for the wafer table (not shown). The host computer furthermore controls a changeover device (23) for the changeover between the two modes of operation and a pattern generator (25).

The pattern generator (25) is deactivated in the projection mode. The control units for the electron-optical components then generate the control and regulating signals for the individual current and voltage supplies which produce the corresponding currents and voltages for the electron-optical elements such as lenses and deflectors. The operation of the tables for the masks and the wafer, and also their position control, are regulated by the respective table control units (24, 28).

The exposure of the wafer takes place in two steps in the method according to the invention. After positioning of the mask and wafer, one or more subfields of the mask are first imaged by parallel projection on the wafer and the wafer is correspondingly exposed, an axially-parallel illumination in the mask plane (8) being ensured by corresponding control signals for the two source-side condenser lenses (2a, 2b). After the completion of the mask exposure, the control unit (21) for the two source-side condenser lenses (2a, 2b) and the control unit (22) for the condenser deflection system (6) are set by a control signal of the host computer (20) so that an image of the electron source (1) arises in a free opening of the mask. The pattern generator (25) and the mode switch (23) are simultaneously activated. The activation of the mode switch (23) then has the effect that successively in this mode of operation, the writing mode, the driving of the rapid deflection system (4) in the condenser, and thus of the beam blanker, and the driving of the control unit (26) for the projector deflection system (14) take place by means of the pattern generator (25). The focused electron beam is now serially guided, using the projective deflection system, to the places of the substrate which are to be exposed, and the beam blanker (4) is momentarily deactivated for exposure. When the exposure is completed, the mask and the wafer are further moved relative to each other and the subsequent exposure or imaging of the next subfield of the mask takes place.

Figure 2:
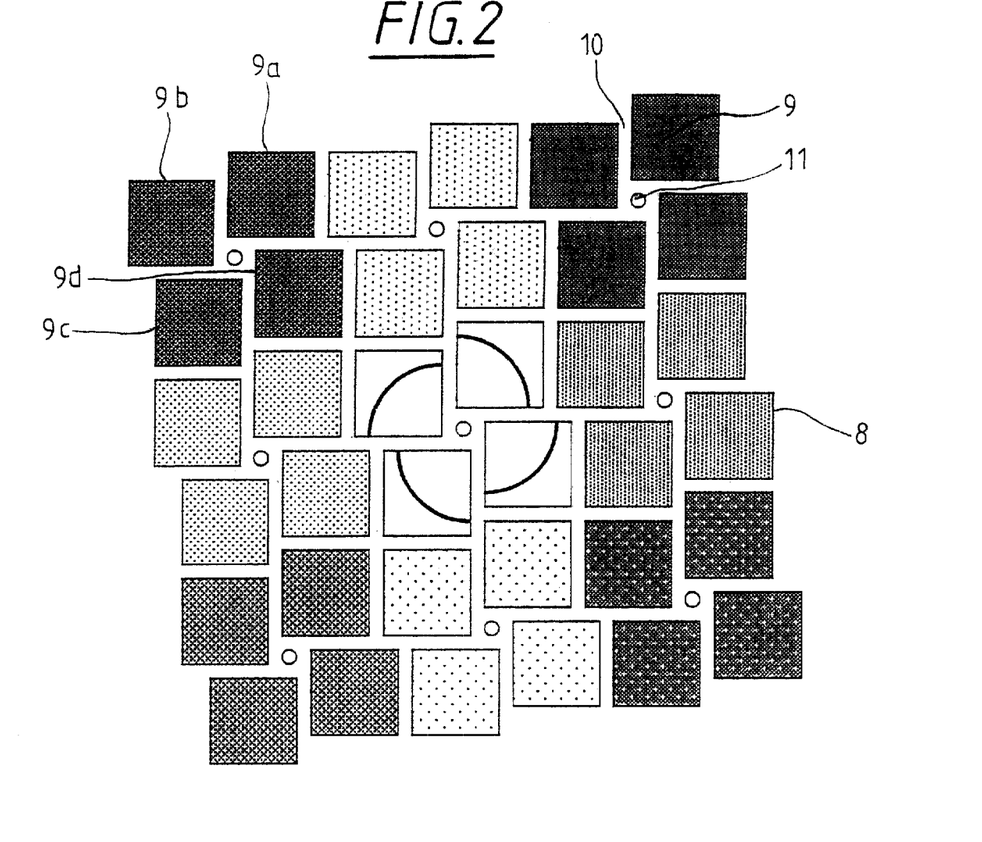
FIG. 2 shows an embodiment of a mask used in the mask plane in connection with the lithography system of FIG. 1.

A view of an exemplary mask is shown in FIG. 2. This mask has a plurality of square subfields (9), 6×6 in the embodiment shown, separated from each other by webs (10) situated between the subfields (9). The individual subfields (9) respectively have a relevant section of the structure to be exposed. Between a respective four subfields (9), the separating webs (10) have through holes (11), the diameter of which is chosen so that it is greater than the diameter of the electron focus in the mask plane (8) for the focused electron beam. For electron beam projection lithography, the two source-side condenser lenses (2a, 2b) produce an image of the crossover of the electron source (1) in the front focal plane of the last condenser lens (7) so that an axially-parallel illumination of the mask (8) is ensured in a respective square subfield. By means of the illumination deflection system (6), the image of the illuminating field diaphragm (3) can be deflected onto the respective subfield (9) to be exposed. The projection lens system (12, 15) images the successively illuminated sub-fields (9) on a reduced scale in the substrate plane (16) and thus on the wafer. With the projection-deflection system (14), the individual subfields are thus seamlessly placed one against another in the substrate plane. This result in the substrate plane is shown in FIG. 3.

If on the other hand, in the writing mode, the crossover of the electron source (1) is imaged in the mask plane (8) by the changed excitation of the two source-side condenser lenses (2a, 2b), the projection optics (12, 15) produces in the substrate plane (16) a focused electron beam which can be guided with the condenser deflection system (14) for the sequential exposure of fine structures at defined positions in the subfields (9). For this purpose, the electron beam is deflected by means of the condenser deflection system (6) so that the electron beam passes through one of the through holes (11) in the mask plane. If the diameter of the through holes (11) in the mask (8) is only insignificantly greater than the diameter of the focused electron beam, or if a suitable arrangement of the holes is provided as a hole code, for example analogous to a bar code, the signal passing through the holes can also be used for adjustment of the mask relative to the optical axis of the electron beam, for example by scanning over the hole edges.

Figure 3:
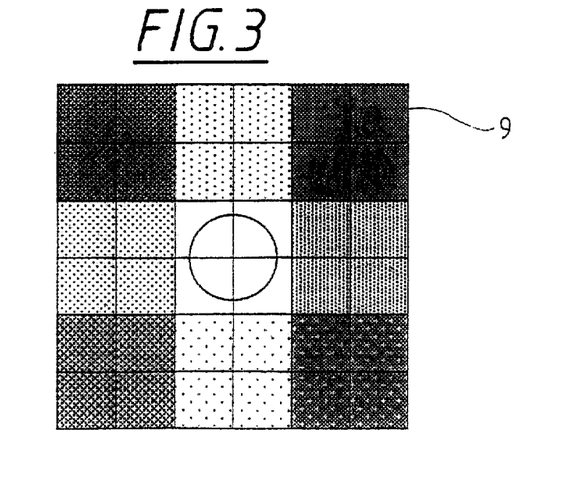
FIG. 3 shows a diagram of the composite image arising after sequential projection of the mask of FIG. 2 in the substrate plane.

Respective four mutually neighboring subfields in FIGS. 2 and 3 have a respective through hole (11) provided in their center, and are given the same hatching. A respective four subfields with the same hatching are successively imaged by means of a purely electron-optical relative displacement, using the two deflection systems (6, 14), without an intermediate mechanical displacement of the mask and wafer taking place. After a respective four subfields (9a–9d) with the same hatching have been projected, the production of the fine structure takes place by electron beam writing, in which the electron beam is focused on the through hole (11) between the four subfields. A mutual displacement of the wafer and mask takes place thereafter, so that the next four subfields can be sequentially projected.

Figure 4:
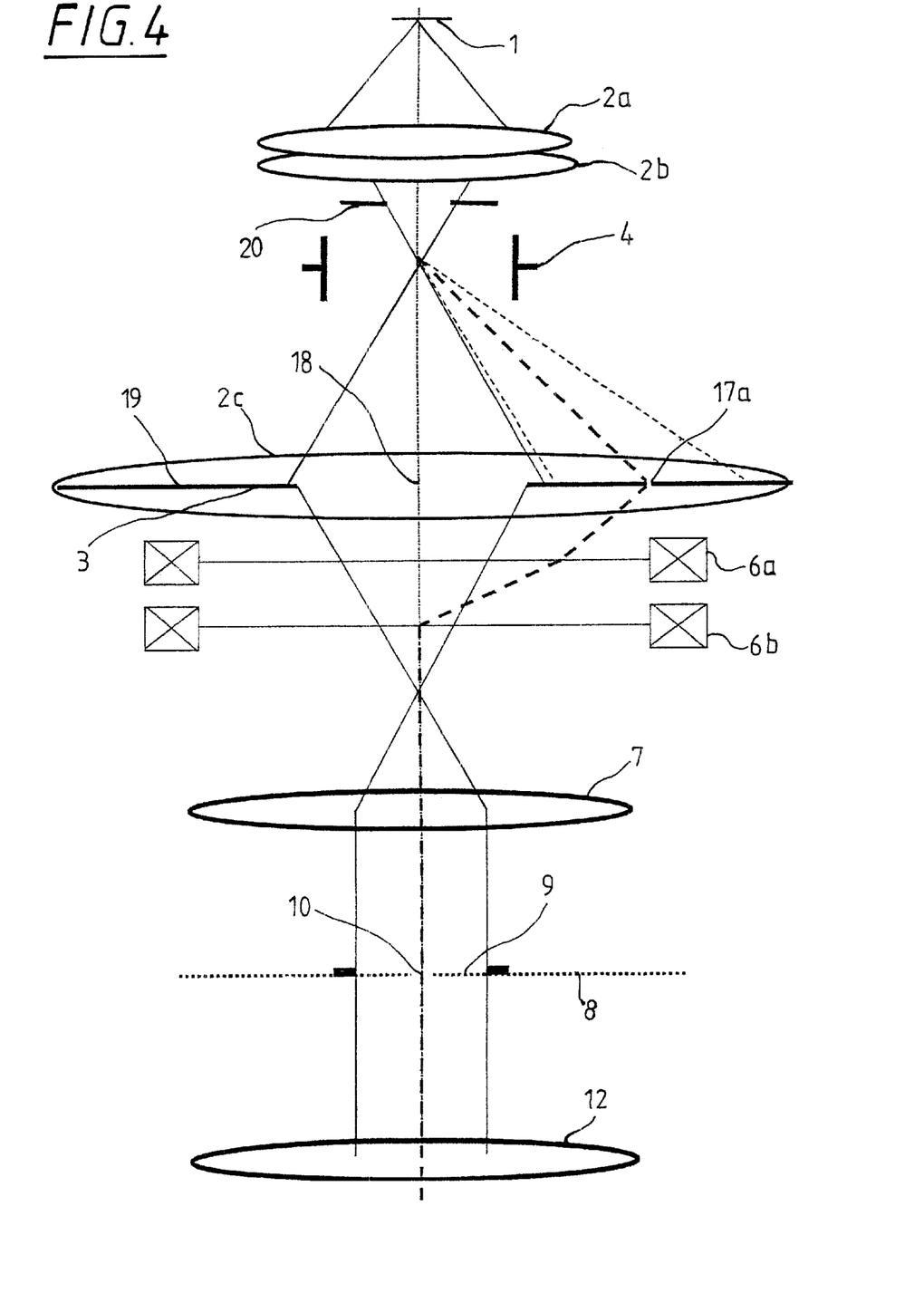
FIG. 4 shows a schematic diagram of the illumination-side portion of a second embodiment of a lithography system according to the invention.
Figure 5:
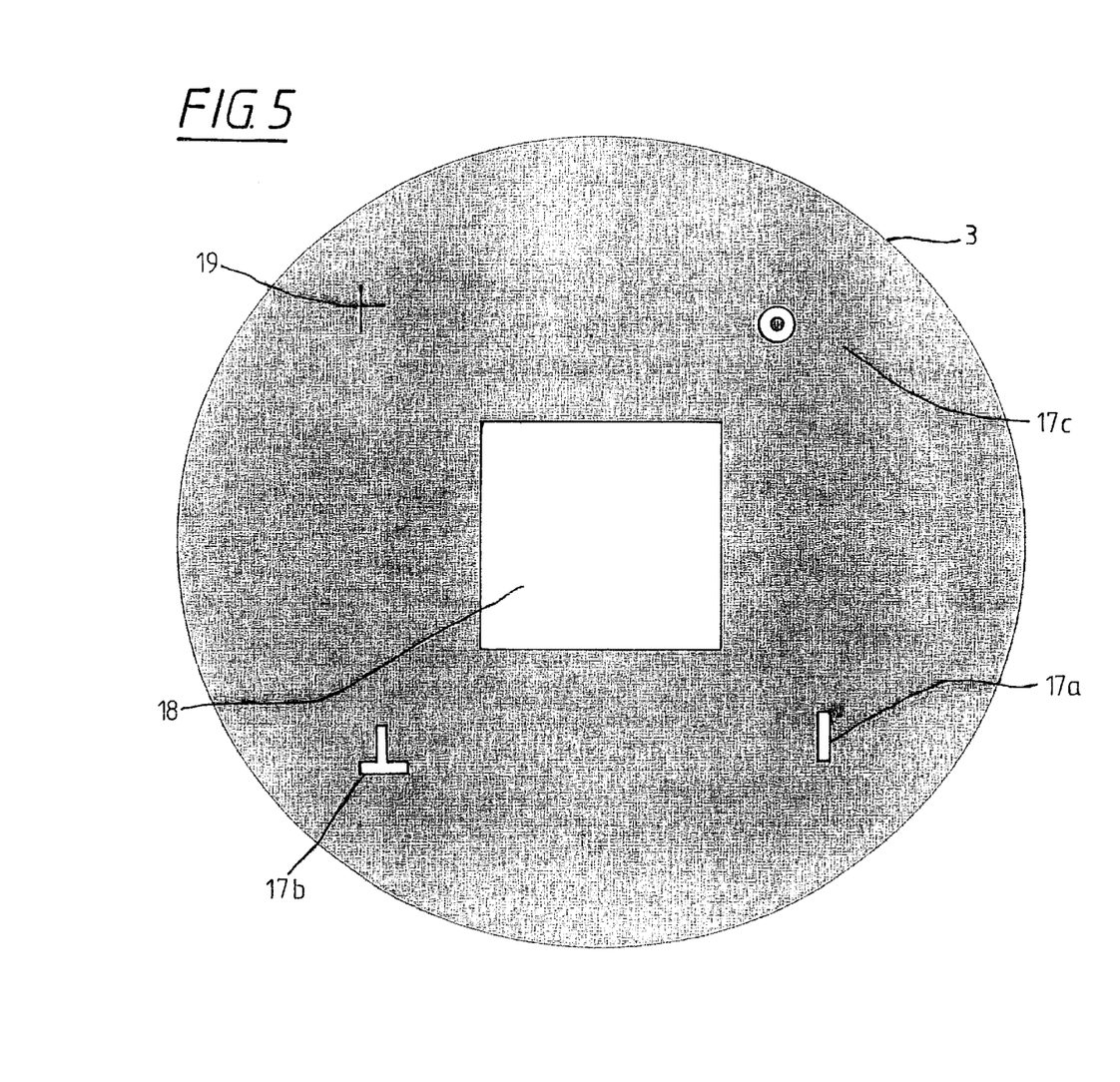
FIG. 5 shows a view of a field diaphragm used with the lithography system according to FIG. 4.

The embodiment in FIG. 4 has substantially a very similar construction to that of the embodiment in FIG. 1. Consequently those components in FIG. 4 that correspond to those in the embodiment of FIG. 1 are given the same reference numerals. A substantial difference between the two embodiments consists in that overall a four-stage condenser is provided as a result of the provision of a further condenser lens (2c) between the two source-side condenser lenses (2a, 2b) and the last condenser lens (7) (formed by the pre-field of the condenser-objective single field lens (7, 12)). A modified field diaphragm (3) is arranged in the main plane of this further condenser lens (2c), and has further decentralized structures (17a, 17b, 17c, 19), in addition to the central opening which defines the field of the subfield (9) to be illuminated for mask projection. The illumination in the illumination field diaphragm (3) is limited by a suitable preceding diaphragm (20) such that only a region is illuminated which is insignificantly larger than the central region (18) of the diaphragm (3).

In regard to its positioning along the optical axis of the electron-optical system, the additional condenser lens (2c) is arranged so that its main plane coincides with the source-side object plane of the last condenser lens (7), or with the pre-field of the condenser-objective single field lens (7, 12). The field diaphragm (3) is thereby imaged in the mask plane (8) in the projection mode. At the same time, differing from the embodiment of FIG. 1, in the projection mode the two source-side condenser lenses (2a, 2b) are excited such that an image of the source is present in the plane of the electrostatic deflection system (4), and is subsequently imaged by the additional condenser lens (2c) with an imaging scale of about 1:1, preferably with an imaging scale between 0.5:1 and 2:1, in the source-side focal plane of the last condenser lens (7).

In this embodiment, the electron beam, after the conclusion of the projection exposure, can be deflected by the rapid electrostatic deflection system (4) onto an off-axis opening of the field diaphragm (3). The electron beam transmitted through the off-axis opening is deflected back in the direction of the optical axis, and onto the optical axis again, by the refracting power of the additional condenser lens (2c) together with a double deflection system (6a, 6b). The electron beam, shaped as desired by the off-axis openings (17a, 17b, 17c), can subsequently pass unhindered through one of the through holes (11) of the mask (8). Analogously to the procedure in projection exposure, the thus shaped electron beam is imaged by the subsequent projective system, no longer shown in FIG. 4, into the substrate plane and can be guided to the place to be exposed using the projective deflection system.

Differing from the embodiment of FIG. 1, in this embodiment the excitation of all the lenses, and thus also that of the two source-side condenser lenses (2a, 2b), remains unchanged on changing over from the projection mode to the writing mode. In the writing mode, the beam cross section is defined by the shape of the selected off-axis hole (17a, 17b, 17c) of the field diaphragm (3). The electron beam shaped by one of the off-axis holes can pass unhindered through the through holes (11) of the mask (8), since the images of the off-axis holes (17a, 17b, 17c) in the mask plane are sufficiently small.

A position (19) without an opening can also be defined on the illumination field diaphragm (3) and can be moved to by the electrostatic deflection system (4) when a dark scanning of the electron beam is desired.

The invention has been described, using the embodiments herein above, for the case in which the last condenser lens (7) is constituted in common with the first projective lens (12) as a condenser-objective single field lens. However, an advantageous embodiment is concerned here. Alternatively to it, the last condenser lens (7) and the first lens of the projective system (12) can also be respectively constituted as independently adjustable individual lenses. This would however entail a needless additional cost, since no use is made of an independent setting of the two lenses, and it leads to poorer imaging performance.

I claim:

1. An electron-optical lithography system comprising:
   an electron source providing an electron beam having a direction of propagation,
   a condenser system,
   a mask plane behind said condenser system as seen in said direction of propagation,
   a projective system that follows said mask plane as seen in said direction of propagation and is excitable such that said mask plane is imaged on a reduced scale in said substrate plane,
   a projector deflection system in or before said projective system as seen in said direction of propagation,
   a substrate plane, and
   a control system,
   wherein said control system is arranged to change over condenser excitation or deflection elements such that a small focused or shaped beam profile is produced in said mask plane, and
   wherein said projector deflection system is driven such that a focused or shaped electron beam with a small beam profile is movable in said substrate plane along stored or computed paths.

2. The electron-optical lithography system according to claim 1, further comprising a condenser aperture diaphragm arranged in a source-side focal plane of a last condenser lens of said condenser system remote from said electron source.

3. The electron-optical lithography system according to claim 1, wherein said condenser system includes a condenser deflection system.

4. The electron-optical lithography system according to claim 1, further comprising an illumination field diaphragm in a plane conjugate with said mask plane.

5. The electron-optical lithography system according to claim 1, wherein a last condenser lens and a first projective lens of said projective system are formed by a first condenser-objective single field lens, and said mask plane is situated in a gap center of said condenser-objective single field lens.

6. The electron-optical lithography system according to claim 1, further comprising a second condenser-objective single field lens that forms a last projective lens of said projective system.

7. The electron-optical lithography system according to claim 1, wherein said projective system is operated as a telecentric system whose source-side focal plane coincides with said mask plane and whose focal plane remote from said electron source coincides with said substrate plane.

8. The electron-optical lithography system according to claim 1, wherein excitation of a last condenser lens of said condenser system and of said projective system remains unchanged on changing over said condenser excitation.

9. The electron-optical lithography system according to claim 3, wherein, in an electron beam focused in said mask plane or shaped before said mask plane, deflection of said electron beam takes place exclusively by said projection deflection system, and said condenser deflection system has constant excitation.

10. The electron-optical lithography system according to claim 4, wherein said illumination field diaphragm has off-axis regions transmissive for electrons and of different shapes for shaping a beam profile of said electron beam.

11. Use of an electron-optical lithography system according to claim 1 for repairing a faulty mask, wherein a focused or shaped electron beam is deflected by a deflection system to a place of said faulty mask to be repaired.

12. A method of electron beam lithography, comprising:
   in a first step electron-optically imaging a mask by a projective system on a substrate to be exposed arranged in a substrate plane, and in a second step guiding a focused electron beam or an electron beam with a shaped profile over said substrate by focusing said electron beam in a plane of said mask or shaping a beam profile of said electron beam before said plane of said mask and deflecting said focused electron beam or said electron beam with a shaped profile by a deflection system.

13. The method according to claim 12, wherein said mask has subfields separated from each other by webs, further comprising successively illuminating different subfields by deflection of said electron beam by a deflection system provided in a condenser system, and successively projecting mutually spatially adjoining subfields.

14. The method according to claim 13, wherein said webs have holes.

15. The method according to claim 14, wherein said holes have a diameter that is larger than a diameter of said electron beam focused by said condenser system.

16. The method according to claim 14, wherein said holes have a diameter that is larger than a greatest dimension of a beam profile of said electron beam in said plane of said mask.

17. An electron-optical lithography system comprising:
an electron source providing an electron beam having a direction of propagation,
a condenser system downstream of said electron source in said direction of propagation,
a mask plane downstream of said condenser system in said direction of propagation,
a projective system downstream of said mask plane in said direction of propagation,
a projection deflection system in said projective system or upstream of said projective system but downstream of said mask plane,
a substrate plane, and
a control system,
wherein said control system provides a first and a second mode of operation,
wherein in said first mode of operation and in said second mode of operation said projective system is excited such that said mask plane is imaged into said substrate plane,
wherein in said first mode of operation said condenser system is excited to illuminate said mask plane by a parallel electron beam,
wherein in said second mode of operation said condenser system is excited to image a cross-over of said electron source into said mask plane, and
wherein in said second mode of operation said projection deflection system is driven to move a focused electron beam in said substrate plane along stored or computed paths.

18. The electron-optical lithography system according to claim 17, further comprising a condenser aperture diaphragm arranged in a source-side focal plane of a last condenser lens of said condenser system remote from said electron source.

19. The electron-optical lithography system according to claim 17, wherein said condenser system includes a condenser deflection system.

20. The electron-optical lithography system according to claim 17, further comprising an illumination field diaphragm in a plane conjugate with said mask plane.

21. The electron-optical lithography system according to claim 17, wherein a last condenser lens and a first projective lens of said projective system are formed by a first condenser-objective single field lens, and said mask plane is situated in a gap center of said condenser-objective single field lens.

22. The electron-optical lithography system according to claim 17, further comprising a second condenser-objective single field lens that forms a last projective lens of said projective system.

23. The electron-optical lithography system according to claim 17, wherein said projective system is operated as a telecentric system whose source-side focal plane coincides with said mask plane and whose focal plane remote from said electron source coincides with said substrate plane.

24. The electron-optical lithography system according to claim 17, wherein excitation of a last condenser lens of said condenser system and of said projective system remains unchanged on changing over said condenser excitation.

25. The electron-optical lithography system according to claim 19, wherein, in an electron beam focused in said mask plane or shaped before said mask plane, deflection of said electron beam takes place exclusively by said projection deflection system, and said condenser deflection system has constant excitation.

26. An electron-optical lithography system comprising:
an electron source providing an electron beam having a direction of propagation,
a condenser system downstream of said electron source in said direction of propagation,
said condenser system comprising at least three electron optical lenses,
a beam forming diaphragm arranged within said condenser system,
a condenser deflection system arranged within said condenser system,
a mask plane downstream of said condenser system in said direction of propagation,
a projective system downstream of said mask plane in said direction of propagation,
a projection deflection system in said projective system or upstream
of said projective system but downstream of said mask plane,
a substrate plane downstream of said projective system in said direction of propagation, and
a control system,
wherein said control system provides a first and a second mode of operation,
wherein in said first and second mode of operation said projective system and said condenser system are excited to image said beam forming diaphragm into said mask plane by said condenser system and to further image said mask plane into said substrate plane by said projective system,
wherein in said first mode of operation said condenser deflection system is driven to direct said electron beam to a particular fixed region of said beam forming diaphragm,
wherein in said second mode of operation said condenser reflection system is driven to direct said electron beam to various different regions of said beam forming diaphragm which are different from said particular fixed region, and
wherein in said second mode of operation said projector deflection system is driven to move said electron beam being shaped by said beam forming diaphragm in said substrate plane along varying stored or computed paths.

27. The electron-optical lithography system according to claim 26, wherein a last condenser lens and a first projective lens of said projective system are formed by a first condenser-objective single field lens, and said mask plane is situated in a gap center of said condenser-objective single field lens.

28. The electron-optical lithography system according to claim 26, further comprising a second condenser-objective single field lens that forms a last projective lens of said projective system.

29. The electron-optical lithography system according to claim 26, wherein said projective system is operated as a telecentric system whose source-side focal plane coincides with said mask plane and whose focal plane remote from said electron source coincides with said substrate plane.

30. The electron-optical lithography system according to claim 26, wherein excitation of a last condenser lens of said condenser system and of said projective system remains unchanged on changing over said condenser excitation.

31. The electron-optical lithography system according to claim 26, wherein, in an electron beam focused in said mask plane or shaped before said mask plane, deflection of said electron beam takes place exclusively by said projection deflection system, and said condenser deflection system has constant excitation.

32. The electron-optical lithography system according to claim 26, further comprising an illumination field diaphragm having off-axis regions transmissive for electrons and of different shapes for shaping a beam profile of said electron beam.

* * * * *